(12) United States Patent
Walt et al.

(10) Patent No.: US 6,200,737 B1
(45) Date of Patent: *Mar. 13, 2001

(54) PHOTODEPOSITION METHOD FOR FABRICATING A THREE-DIMENSIONAL, PATTERNED POLYMER MICROSTRUCTURE

(75) Inventors: David R. Walt, Lexington; Brian G. Healey, Sommerville, both of MA (US)

(73) Assignee: Trustees of Tufts College, Boston, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/519,062

(22) Filed: Aug. 24, 1995

(51) Int. Cl.[7] .................................................... G02B 6/08
(52) U.S. Cl. ............................ 430/320; 430/5; 430/321; 422/82.06; 422/82.11
(58) Field of Search .................................. 430/1, 2, 320, 430/5, 321; 359/34, 35; 422/82.06, 82.11

(56) References Cited

U.S. PATENT DOCUMENTS

| | | | |
|---|---|---|---|
| 3,748,975 | 7/1973 | Tarabocchia | 354/354 |
| 4,125,314 | 11/1978 | Haskell et al. | 359/34 |
| 4,448,485 | 5/1984 | Bergman et al. | 359/328 |
| 5,244,636 | 9/1993 | Walt et al. | 422/42.06 |
| 5,250,264 | 10/1993 | Walt et al. | 422/82.06 |
| 5,302,509 | 4/1994 | Cheeseman | 435/6 |
| 5,320,814 | 6/1994 | Walt et al. | 422/82.06 |
| 5,342,737 | 8/1994 | Georger, Jr. et al. | 430/324 |
| 5,435,724 | 7/1995 | Goodman et al. | 433/215 |
| 5,518,863 | 5/1996 | Pawluczyk | 430/321 |

FOREIGN PATENT DOCUMENTS 3-143649 6/1991 (JP).
5-203822 8/1993 (JP).

OTHER PUBLICATIONS

DeForest, "Photoresist Materials and Processing", McGraw–Hill, pp. 88–101, 1975.*
U. Levy et al. "Direct Picture Transmission—with hologhrapic filters", Optics Commun. vol. 30(2) pp. 163–165, Aug. 1979.*
Grime, Holographic Diffraction Gratings in Photoresist, in Non–silver Photographic Processes., pp. 275–285 (© 1975).

* cited by examiner

Primary Examiner—Martin Angebranndt
(74) Attorney, Agent, or Firm—Flehr Hohbach Test Albritton & Herbert LLP; David J. Brezner; Robin M. Silva

(57) ABSTRACT

The present invention is a photodeposition methodology for fabricating a three-dimensional patterned polymer microstructure. A variety of polymeric structures can be fabricated on solid substrates using unitary fiber optic arrays for light delivery. The methodology allows micrometer-scale photopatterning for the fabricated structures using masks substantially larger than the desired dimensions of the microstructure.

3 Claims, 7 Drawing Sheets

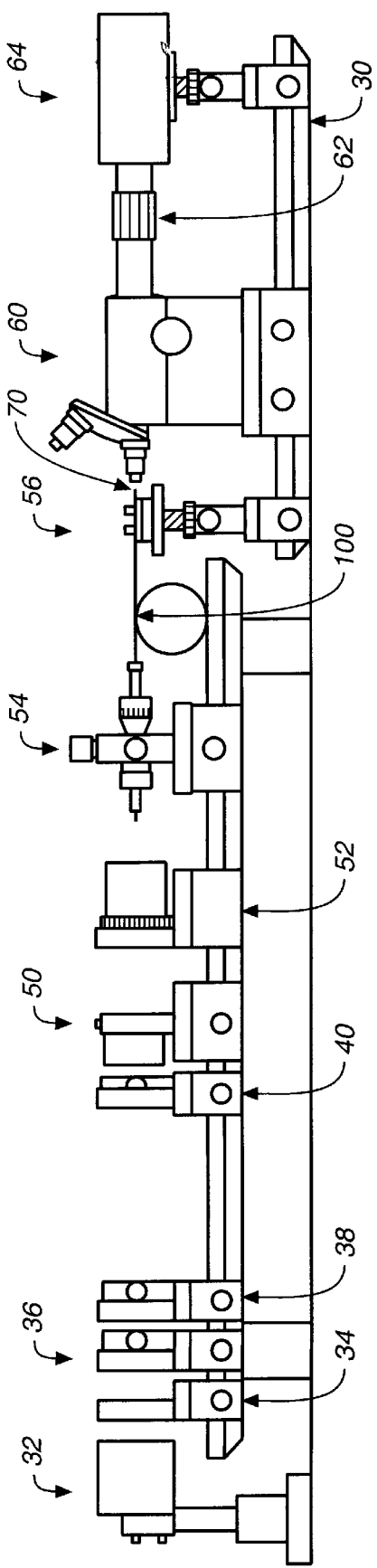
FIG._1
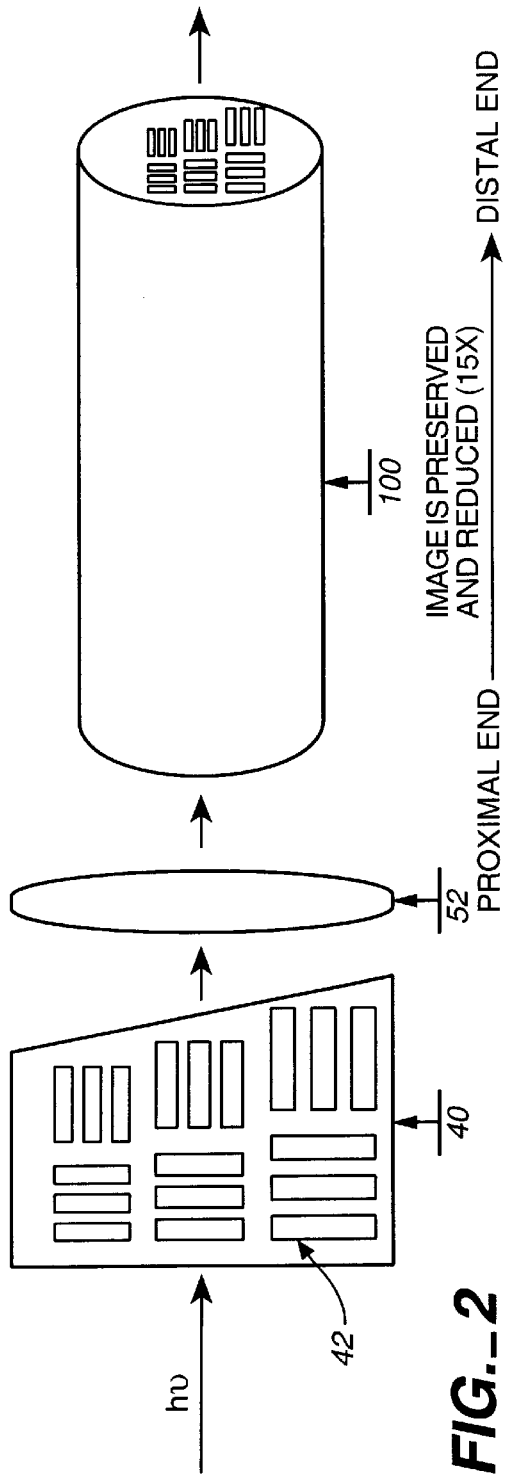
FIG._2

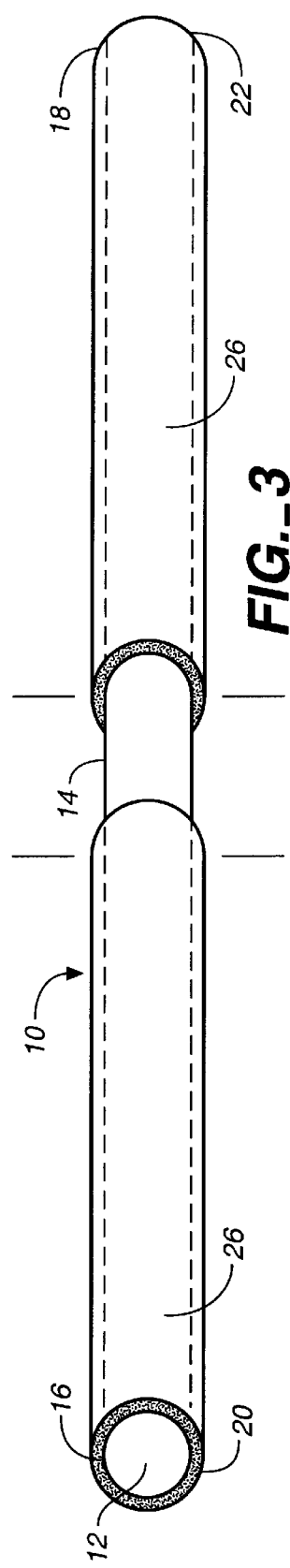
FIG._3
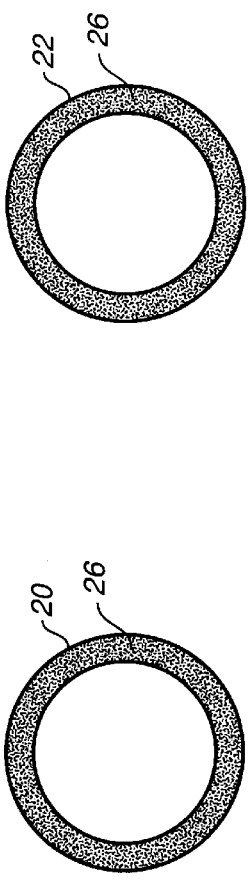
FIG._4A
FIG._4B
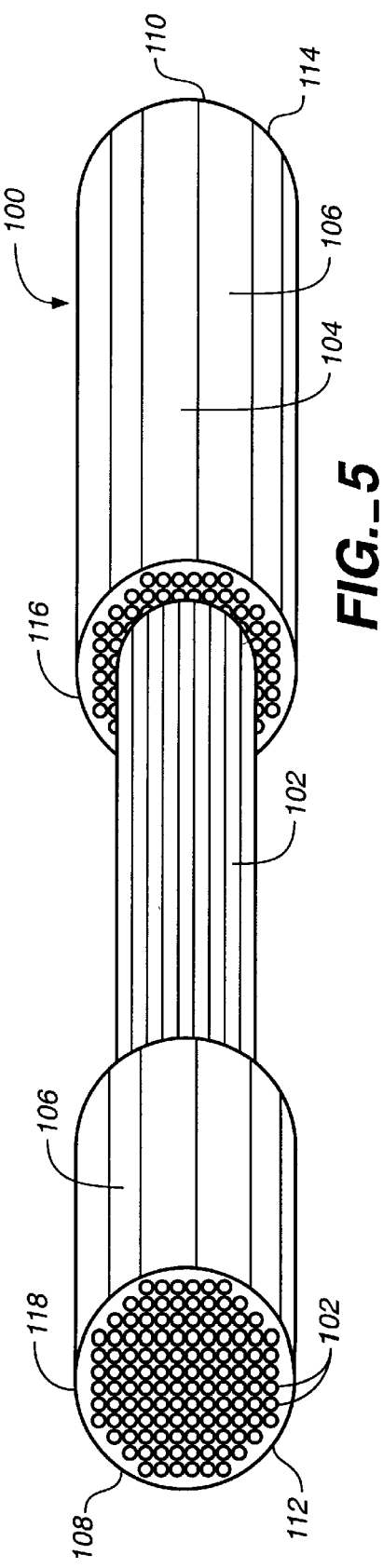
FIG._5

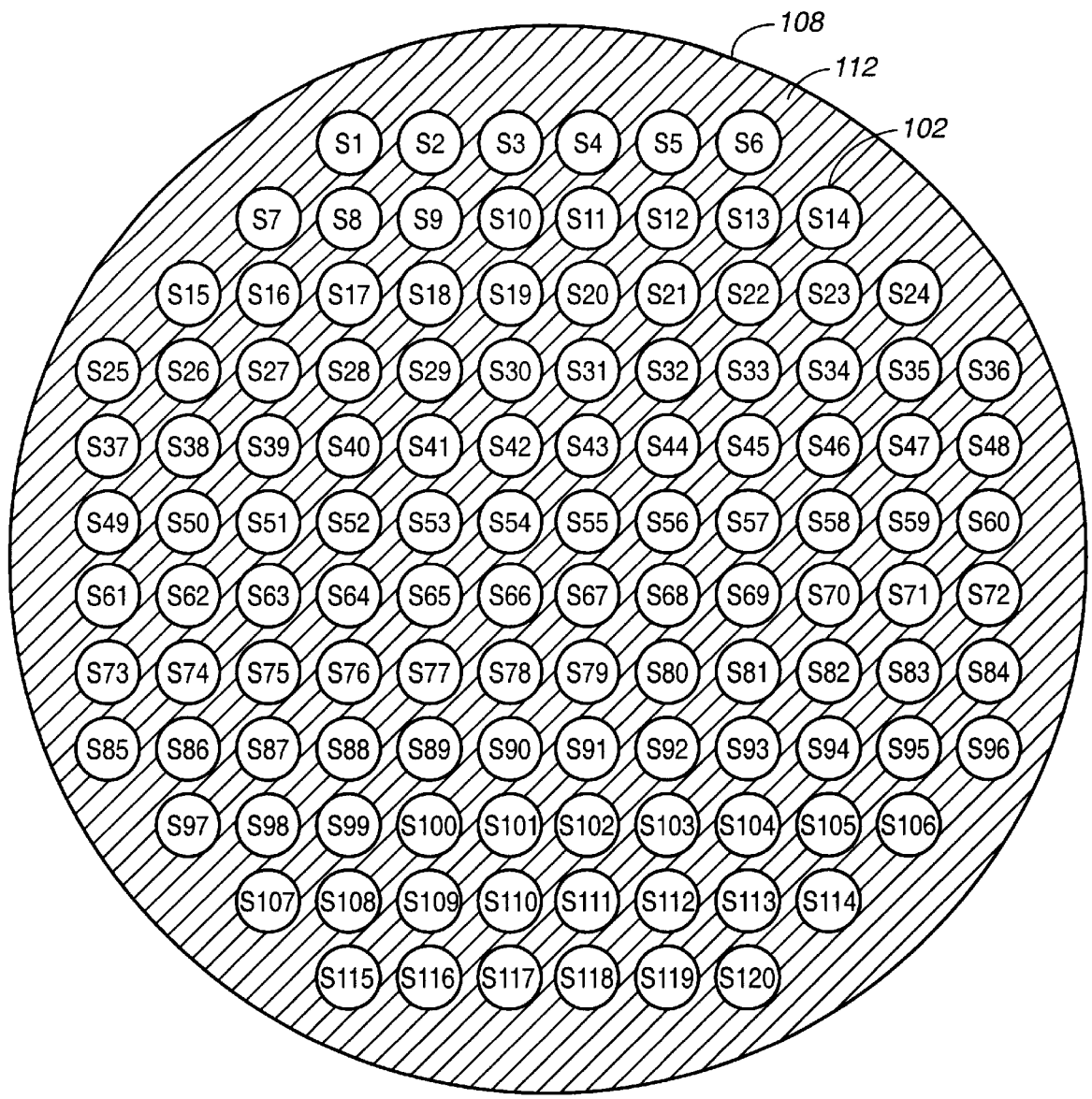
FIG._6

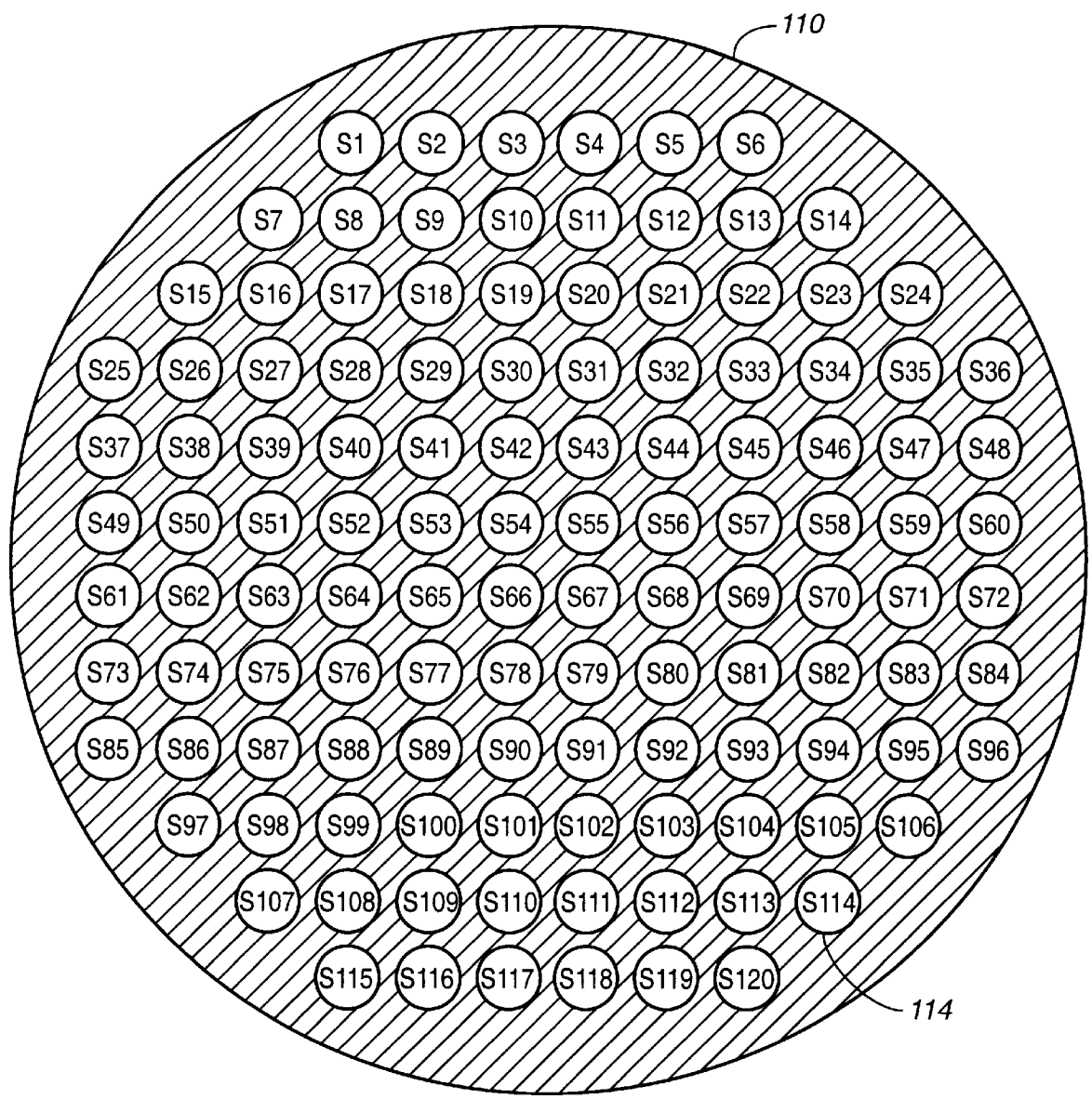
FIG._7

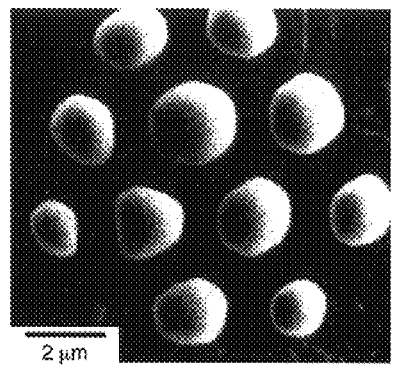
FIG._8A
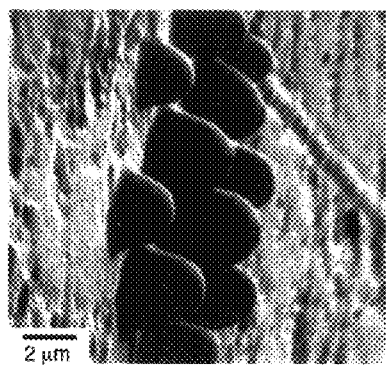
FIG._8B
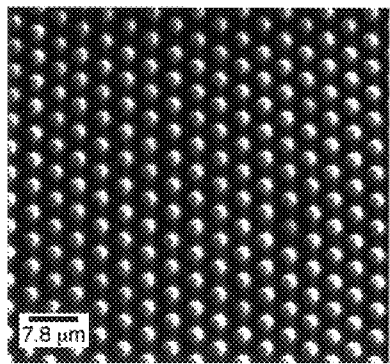
FIG._8C
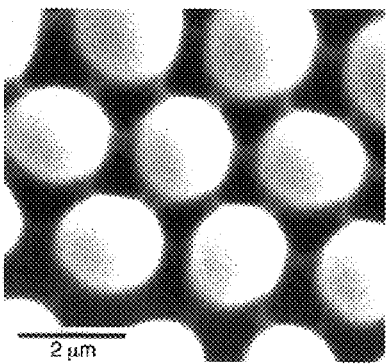
FIG._8D

FIG._9A
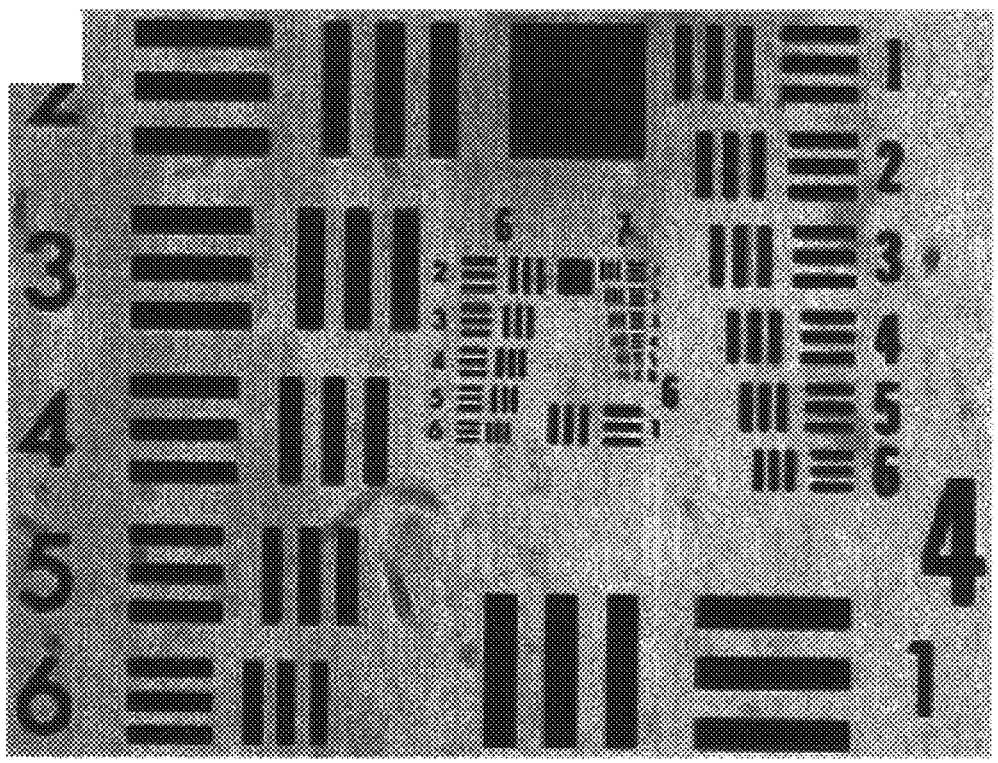
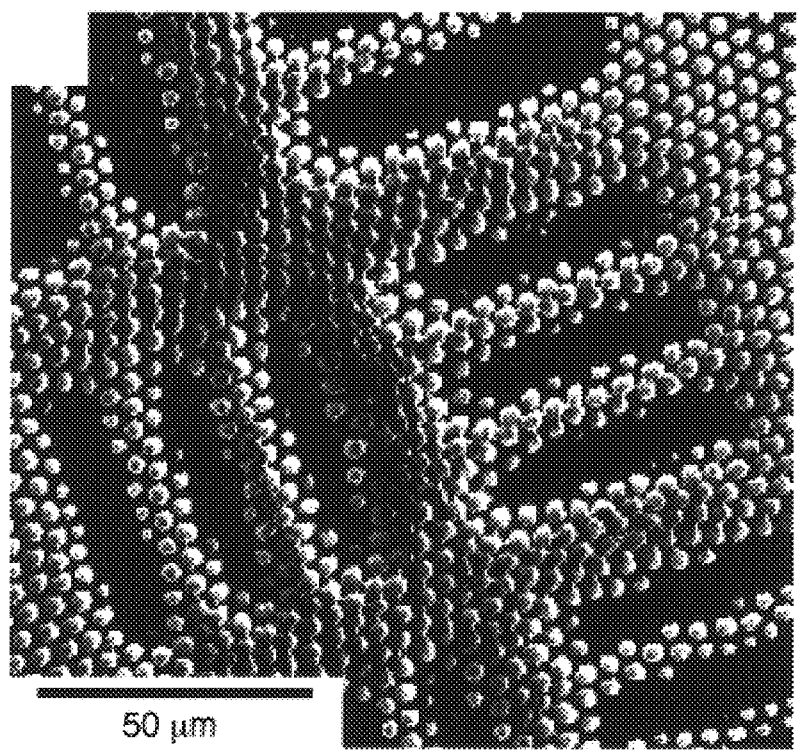
50 μm
FIG._9B

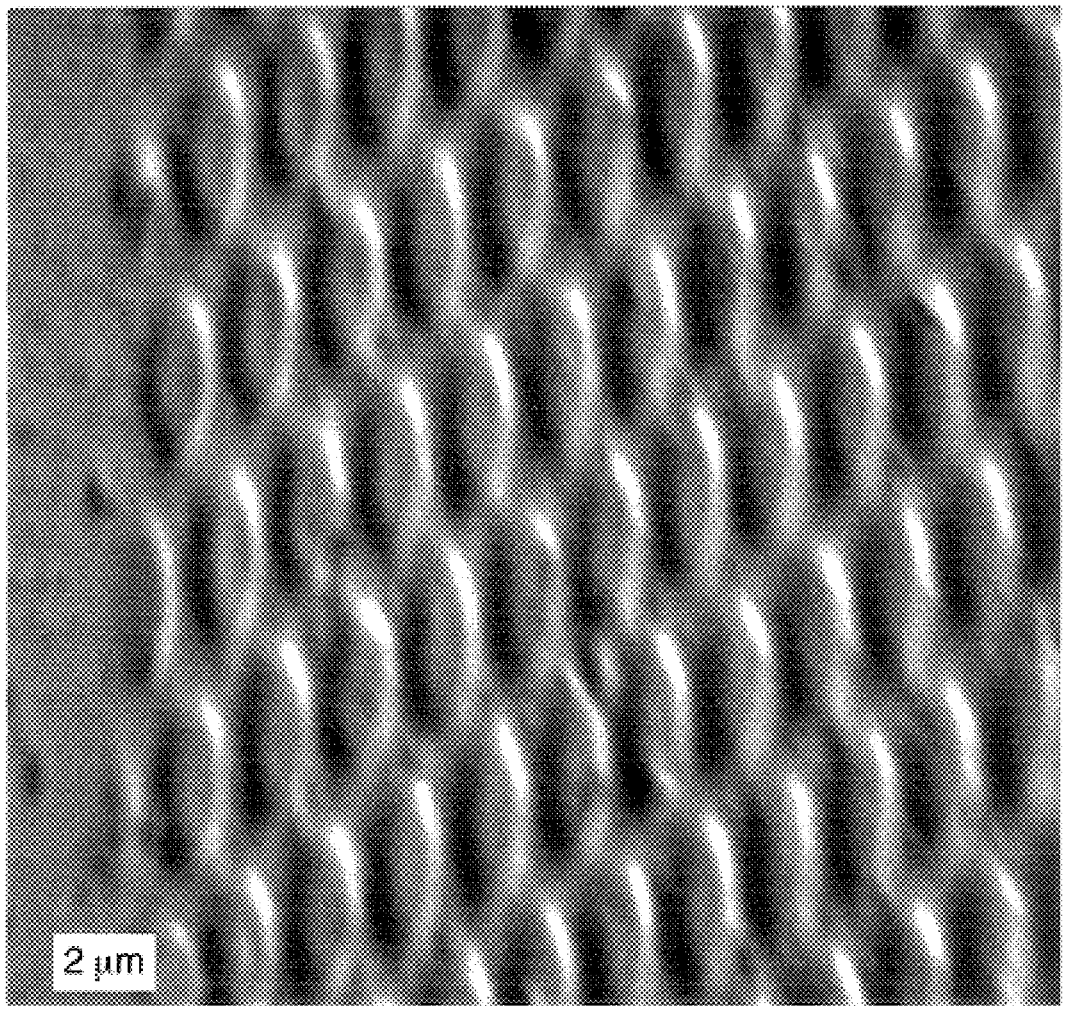
FIG._10

PHOTODEPOSITION METHOD FOR FABRICATING A THREE-DIMENSIONAL, PATTERNED POLYMER MICROSTRUCTURE

FIELD OF THE INVENTION

The invention is concerned generally with the manufacture of micrometer scale structures of preplanned precision patterns; and is specifically directed to photopolymerization and photodeposition techniques using fiber optic arrays for the fabrication of microstructures of prearranged patterns and precise scale.

BACKGROUND OF THE INVENTION

In recent years there has been considerable interest and substantial development in the manufacture and use of precision-pattern micrometer and nanometer sized structures for use in a variety of different applications. The range of applications has come to include the use of these microstructures as diffraction gratings, femtoliter reaction wells, underlying supports for chromatography gels, as well as usages in the form of nanotubes, nanowires, quantum dots, microspheres, and nanometer-sized light-emitting diodes. Most of these micrometer and nanometer sized structures have been fabricated as ensembles—i.e., structures of varying size and poorly-defined positions rather than precisely patterned arrangements; and it is clearly the absence of precisely-defined microstructures in carefully prechosen arrangements and patterns which remains today the major obstacle inhibiting, if not directly preventing, further advancement in this field.

Some reasonably defined and complex-patterned microstructures have been produced using differing techniques. For example, laser-assisted chemical vapor deposition ("LCVD") has been recently used to fabricate some complex well-defined microstructures [Wallenberger, F. T., *Science* 267: 1274–1275 (1995)]. Also, precision microstructures have been fabricated by the creation of hydrophobic templates from photoresists for the deposition of self-assembled monolayers ("SAMs") on gold [Gorman et. al., *Chem. Mater.* 7:252–254 (1995); Singhvi et. al., *Science* 264:696–698 (1994)]. In addition, photoactivation techniques have also been used to fabricate some well-defined microstructures. As one representative example, photolithography has been used for information storage in photoconductive materials [Liu et. al. *Science* 261:897–899 (1993)]; in photoassembly of combinatorial libraries [Noble, D., *Anal. Chem.* 67:201A–204A (1995); Fodor et. al., *Science* 251: 767–773 (1991)]; and for site-selective covalent attachment of biomolecules [Yan et. al., *J. Am. Chem. Soc.* 115:814–816 (1993); Rozsnyai et. al., *Angew. Chem. Int. Ed. Engl.* 31:759–761 (1992)].

Although all of these reported fabrication techniques have been used successfully on occasion to produce micrometer scaled structures, all of these present substitutive limitations and difficulties for the user. For instance, the LCVD technique can produce ultrapure materials, but has yet to be employed for any fabrication of polymeric compositions or polymer structures. These difficulties and limitations represent major obstacles and substantial hindrances in the presently known technology available to date for manufacturing precision pattern microstructures.

As a concurrent but essentially unrelated series of developments, the use of optical fiber strands and fiber optic arrays, alone and in combination with light energy absorbing dyes, has rapidly evolved for imaging and biochemical, and chemical analytical determinations, particularly within the last decade. The use of optical fibers for such purposes and techniques is described by Milanovich et. al., "Novel Optical Fiber Techniques For Medical Application", Proceedings of the SPIE 28th Annual International Technical Symposium On Optics And Electro-Optics, Volume 494, 1980; Seitz, W. R., "Chemical Sensors Based On Immobilized Indicators And Fiber Optics" in *C.R.C. Critical Reviews In Analytical Chemistry*, Vol.19,1988, pp. 135–173; Wolfbeis, O. S., "Fiber optical Fluorosensors In Analytical Chemistry" in *Molecular Luminescence Spectroscopy, Methods And Applications* (S. G. Schulman, editor), Wiley & Sons, New York (1988); Angel, S. M., *Spectroscopy* 2(4):38 (1987); and Walt et. al., "Chemical Sensors and Microinstrumentation", *ACS Symposium Series*, volume 403,1989, p. 252; *Fiber Optical Chemical Sensors And Biosensors*, (O. S. Wolfbeis, edition), CRC: Boca Raton, Fla., vol. 2, 1991, pp. 267–300; *Biosensors With Fiber Optics*, HUMANA, Clifton, N.J. 1991.

Optical fiber strands typically are glass or plastic extended rods having a small cross-sectional diameter. When light energy is projected into one end of the fiber strand (conventionally termed the "proximal end"), the angles at which the various light energy rays strike the surface are greater than the critical angle; and such rays are "piped" through the strand's length by successive internal reflections and eventually exit from the opposite end of the strand (conventionally termed the "distal end"). Typically, bundles of these strands are used collectively as imaging optic fiber arrays in a variety of different applications.

For making an imaging optical fiber into a chemical sensor, one or more light energy absorbing dyes are typically attached to the distal end of the optical fiber strand. The chemical sensor can then be used for both in-vitro and/or in-vivo applications. As used herein, light energy is photoenergy and is defined as electromagnetic radiation of any wavelength. Accordingly, the terms "light energy" and "photoenergy" include infrared, visible, and ultraviolet wavelengths conventionally employed in most optical instruments and apparatus; the term also includes the other spectral regions of X-ray and microwave wavelengths (although these are generally not used in conjunctions with optical fibers).

Many of the recent improvements employing optical fiber sensors in both qualitative and quantitative analytical determinations concern the desirability of depositing and/or immobilizing various light absorbing dyes at the intended distal end of an imaging optical fiber. For this purpose, a variety of different optical fiber chemical sensors and methods have been reported for specific analytical determinations and applications such as pH measurement, oxygen detection, and carbon dioxide analyses. These developments are exemplified by the following publications: Freeman et. al., *Anal. Chem.* 53:98 (1983); Lippitsch et. al., *Anal. Chem. Acta.* 205–1 (1988); Wolfbeis et. al., *Anal. Chem.* 60:2028 (1988); Jordan et. al., *Anal. Chem.* 59:437 (1987); Lubbers et. al., *Sens. Actuators* (1983); Munkholm et. al., *Anal. Chem.* 58:1427 (1986); Seitz, W. R. *Anal. Chem.* 56:16A–34A (1984); Peterson et. al., *Anal. Chem.* 52:864 (1980); Saari et. al., *Anal. Chem.* 54:821 (1982); Saari et. al., *Anal. Chem.* 55:667 (1983); Zhujun et. al., *Anal. Chem.* 56:2199 (1984); Collison, M. E. and M. E. Meyerhoff, *Anal. Chem.* 62:425A (1990); Demas, O. N. and B. A. DeGraff, *Anal. Chem.* 63:809A(1991); Seitz, W. R., *CRC Crit. Rev. Anal. Chem.* 19:135 (1988); Kopelman et. al., *Science* 258:778 (1992); Janata, J., *Anal. Chem.* 64:196R (1992); and Orella et. al., *Anal. Chem.* 64:2210 (1992); Janata, J., *Anal. Chem.* 66:207R (1994); Cohen, C. B., *Anal. Chem.* 65:169 (1993);

Pantano, P., *Anal. Chem.* 67:481A (1995); Rozenzweig, Z., *Anal. Chem.* 67:2650 (1995); Kar, S., *Anal. Chem.* 64:2438 (1992); Wong, A., *Anal. Chem.* 64:1051 (1992); Vttamlal, M., *Biotechnology* 13:597 (1995); Barnard, S., *Nature* 353:338 (1991); Bronk, K., *Anal. Chem.* 66:3519 (1994). See also U.S. Pat. Nos. 4,822,746; 4,144,452; 4,495,293; 5,143,853; 5,244,636; 5,244,813; 5,250,264; 5,252,494; 5,254,477; 5,298,741; and the references cited within each of the issued patents.

Moreover, in view of the microcircuitry and enhanced television technology presently available, a variety of light image processing and analytical systems have come into existence in order to both enhance, analyze and mathematically process the light energies introduced to and emerging from the absorbing dyes in such optical analytical techniques. Typically, these systems provide components for image capture; data acquisition; data processing and analysis; and visual presentation to the user. Commercially available systems include the $InCa^{++}$ system from Intracellular Imaging, Inc. (Cincinnati, Ohio) and the Videometric 150 system from Oncor, Inc. (Gaithersburg, Md.) Each of these systems may be combined with microscopes, cameras, and/or television monitors for automatic processing of all light energy determinations.

Despite all these developments in the use of fiber optic strands and arrays, both for imaging purposes and/or as chemical sensors, no bridge, linkage, suggestion, or query has been made or reported to date, insofar as is presently known, to utilize optical fiber technology for the potential fabrication of precision patterned, micrometer-sized, polymer structures. Accordingly, were a technique created which could employ optical fiber imaging methods and apparatus to generate micrometer sized polymer structures with precision-defined features, such an innovative method would be recognized as substantive achievement as well as a major advancement by all persons working in this technical field.

SUMMARY OF THE INVENTION

The present invention is a photodeposition method for fabricating a three-dimensional, patterned polymer microstructure. The photodeposition method comprises the steps of:

furnishing at least one shaft of light energy of determinable wavelength and intensity;

providing means for converting said shaft of light energy into a prechosen photopattern comprised of at least one light energy ray having a fixed configuration supplying a preformed, unitary fiber optic array comprising a plurality of clad optical fiber strands disposed co-axially along their lengths and having two discrete optical array end surfaces each formed of multiple optical fiber strand end faces, said preformed, unitary fiber optic array being of determinable configuration and dimensions, and said discrete optic array end surfaces presenting multiple optical fiber strands and strand end faces having a limited and prechosen breadth ranging from about 1.0 micrometers to about 50 micrometers in size for conveyance and discharge of light energy;

preparing a fluid prepolymer reaction mixture comprising at least one photoinitiator, at least one solvent, and at least one chemical entity selected from the group consisting of monomers, dimers, oligomers, copolymers, and homopolymers that can be photo-crosslinked to yield a photodeposited polymer product;

disposing a quantity of said prepared fluid prepolymer mixture on the surface of a solid substrate;

introducing said light energy ray photopattern to at least a portion of said multiple optical fiber strand end faces forming one optic array end surface of said unitary fiber optic array whereby said introduced light energy rays become divided into multiple beams of light energy which are individually conveyed through said multiple optical fiber strands of said unitary fiber optic array and wherein said conveyed beams are discharged from at least a portion of said multiple optical fiber strand end faces forming the other optic array end surface of said unitary fiber optic array as multiple individual beams of light energy having a limited breadth ranging from about 1.0 micrometers to about 50 micrometers in size, and wherein said discharged multiple individual beams of light energy present a migrating patterned template of arranged silhouetted zones and configured light energy zones;

directing the migration of said patterned template of arranged silhouetted zones and configured light energy zones to said fluid prepolymer reaction mixture disposed upon said solid substrate for a set time period whereby a photodeposited, three-dimensional, polymer microstructure is fabricated on the surface of said solid substrate, said fabricated polymer microstructure presenting at least one shaped polymeric projection having a breadth ranging from about 0.5 micrometers to about 50 micrometers which corresponds in shape to said configured light energy zones of said patterned template and presenting at least one shaped cavity having a breadth ranging from about 0.1 micrometers to about 50 micrometers which corresponds in shape to said arranged silhouetted zones of said patterned template.

BRIEF DESCRIPTION OF THE FIGURES

The present invention may be more easily and completely understood when taken in conjunction with the accompanying drawing, in which:

FIG. 1 is an illustration of a photodeposition assembly and system using the present method for micrometer sized structure fabrication;

FIG. 2 is an illustration schematically showing the preservation of mask photopattern when imaged onto the proximal end of an imaging unitary fiber optic array;

FIG. 3 is an overhead view of an individually clad, optical fiber strand;

FIGS. 4A and 4B are views of the proximal and distal ends of the optical fiber strand of FIG. 3;

FIG. 5 is an overhead view of a preformed, imaging unitary fiber optic array using the optical fiber strand of FIG. 3;

FIG. 6 is a view of the intended proximal optic array end surface for the unitary fiber optic array of FIG. 5;

FIG. 7 is a view of the intended distal optic array end surface for the unitary fiber optic array of FIG. 5;

FIGS. 8A–8D are scanning electron micrographs of photodeposited microstructures fabricated using the present invention;

FIGS. 9A and 9B are photographs of an air force resolution target mask and the resulting patterned polymer microstructure fabricated using the present invention; and FIG. 10 is a scanning electron micrograph of a polymer microstructure photodeposited on a glass substrate using the present invention.

DETAILED DESCRIPTION OF THE INVENTION

The present invention is marked improvement and advance in the manufacture of nanometer and micrometer sized polymer structures which are fabricated in accordance with a prechosen, overall pattern of projections and cavities in a planned arrangement. The invention is thus a methodology which utilizes a fiber optic array, photopolymerization techniques, and a photodeposition of precisely patterned polymer features for the fabrication of a three-dimensional microstructure. Although this unique methodology utilizes conventionally known optical fiber technology, assemblies, and systems for the fabrication of micrometer sized structures, it will be recognized and appreciated that the present methodology provides multiple benefits and major advantages not previously known or available heretofore. These include the following:

1. The methodology employs a preformed, unitary fiber optic array which comprises multiple optical fiber strands and strand end faces and has a limited and prechosen overall diameter ranging from about 100 micrometers to about 1 centimeter for the conveyance and discharge of light energy of a fixed wavelength and intensity. The use of this unitary fiber optic array thus provides for the generation, conveyance, and discharge of multiple individual beams of light energy having a limited and prechosen breadth ranging from 1–50 micrometers in size. Each individual beam of light energy thus can provide the means for fabricating a precisely-defined polymeric projection or elevation which is 1 micrometer in width; and concurrently can generate on demand an adjacently positioned polymeric cavity as small as 100 nanometers in diameter. Conversely, polymeric projections and cavities can be precisely fabricated in adjacently located positions which are as large as 50 micrometers in breadth.

2. The methodology can employ any source of light energy of determinable wavelength and intensity to provide a broad shaft of light; and provides masking means for converting the broad shaft of light energy into a prechosen photopattern of light energy rays having a fixed configuration. When employed with the unitary fiber optic array, the light energy ray photopattern provided by the masking means will generate not only multiple individual beams of light energy having a limited and prechosen breadth ranging from about 1.0–50 micrometers in size, but also cause the discharged multiple individual beams of light energy present an overall template of arranged silhouetted zones and configured light energy zones which will create a precisely defined patterned arrangement for the polymer microstructure to be fabricated.

3. The methodology relies upon a photoinitiation, photoactivation, and photodeposition of a prepared fluid reaction mixture to fabricate the desired microstructure. The fluid reaction mixture is pre-prepared and comprises at least one photoinitiator, optionally one liquid solvent, and at least one chemical entity selected from the group consisting of monomers, dimers, oligomers, copolymers, and homopolymers that can be photocrosslinked to yield a photodeposited polymer reaction product. The formulation and chemical composition of the polymer employed as the material of the micrometer-sized structure can thus be chosen from a broad variety of different reagents to yield a photodeposited polymer product which can vary markedly in its physical and chemical properties. In addition, the fluid reaction mixture may be optionally varied to include a diverse range of other ligands such as metals, dyes, enzymes, and other active chemical entities.

4. The present methodology provides for the fabrication of microstructures using imaging optical fibers and photopatterning techniques using masks larger than the desired dimensions of the projections and cavities to be formed in the arranged microstructure. In this manner, polymeric structures are produced which emphasize either the size of the elevated projection or emphasize the criticality of the cavity area surrounded by elevated walls. The narrowest microstructures contained projections which were as small as 500 nanometers. Alternatively, polymeric structures are produced in carefully arranged patterns having elevated walls 2–3 micrometers thick and which are spaced apart at a distance of 4–5 micrometers, center to center. The present methodology thus allows the user to emphasize the criticality most important and necessary for a particular application; and permits the user to employ a fabrication technique which will assure a microstructure product which conforms and achieves the precise dimensions and spatial patterned appearance required for a particular application. Applications for which the microstructures formed by the method of the present invention would be particularly useful include, but are not necessarily limited to, diffraction gratings, microlenses, electroactive microelectrodes, and microstructures comprised of bundles of polymeric microfibers.

5. The present methodology optionally permits the user to employ a fully automated, monitored, and even computer-controlled system for the fabrication of micrometer sized structures. A number of alternative apparatus and system formats are possible and suitable. The goal of all these automated systems is to provide the user with an apparatus, an assembly, and a system that can display light energy of a determinable wavelength and intensity and initiate the photodeposition process nearly simultaneously.

6. In one desirable apparatus format, the methodology employs the unitary fiber optic array with a microscope objective, a camera, and a computerized processing program. In this embodiment providing a fully automated and computer controlled processing system, the intensity, wavelength, and configured pattern of light energy is carefully controlled; the configured light energy is introduced to the appropriate portions of the unitary fiber optic array at specifically controlled occasions and durations; and the resulting optic images and emerging light photons conveyed and discharged appear as overall patterns of arranged silhouetted zones and configured light energy zones for precisely controlled photodeposition of a prepared fluid reaction mixture. By using such a fully automated, computer controlled apparatus system, not only are a variety of different patterned arrangements of microstructures available, but also the speed, reproducibility, accuracy of and manufacture of microstructure fabrication will meet and conform to industrial quality control standards.

Since the present methodology may be employed and practiced using multiple formats, assemblies, and systems for the fabrication of a diverse variety of divergent nanometer and micrometer scaled polymer structures, the subject matter as a whole which is the present invention will be presented and described as an assembled system, as essential component parts of the apparatus, and then as a series of manipulative steps in order that the prospective user may more quickly recognize and appreciate the major differences and distinctions in methodology in comparison to the conventionally known techniques for fabricating microstructures.

I. A Preferred Assembly and System for Practicing the Fabrication Methodology A preferred and highly desirable photodeposition assembly and system for the fabrication of micrometer scale pattern structures is illustrated by FIG. 1. As seen therein, the assembly 30 desirably includes a mercury-xenon (Hg—Xe) lamp 32, a collimating lens 34, a series of neutral density filters 36, excitation filters 38, masking means 40, an electronic shutter 50, a 15× reflecting microscope objective 52, an XY-positioner with a 360° rotation and fiber chuck 54, a unitary fiber optic array 100, a V-groove optic fiber array holder 56, a modified microscope 60, a microscope-CCD camera adapter 62, and a CCD camera 64. When performing the present fabrication methodology, white light from a 75 watt, 1.0 mm arc, mercury-xenon lamp 32 is collimated; focused by the lens 34; passed through the excitation filter 38 at a fixed wavelength; passed through the masking means 40 and focused on the proximal end of the unitary fiber optic array 100 through the 15× reflecting microscope objective 52. The unitary fiber optic array 100 is held in aligned position by the XY-positioner 54 which allows for fine focusing of the masked light energy as a prechosen photopattern of light energy rays having a fixed configuration. This photopattern of light energy rays in fixed configuration is introduced to the proximal end of the unitary fiber optic array and generates multiple individual beams of light energy having a limited and prechosen diameter ranging from about 1–50 micrometers in size. The individual beams of light energy are conveyed over the axial length of the unitary fiber optic array 100 and are discharged from the distal end as an overall template of arranged silhouetted zones and configured light energy zones. In aligned position with the beams of light energy discharged from the unitary fiber optic array 100 is a prepared fluid reaction mixture 70 which has been disposed on the surface of a solid substrate in preparation for the polymerization and photodeposition. The modified microscope 60 is in aligned position for viewing the polymerization and photodeposition processing; and the microscope CCD camera adapter 62 and CCD camera 64 contains a photosensitive element, which in turn is connected to a video frame grabber graphic card that digitizes and processes the video image. Visual imaging is achieved by using the CCD video camera to collect the light energy which passes through to the modified microscope 60.

The preferred assembly illustrated by FIG. 1 utilizes a unitary fiber optic array 100 which is preferably prepared in advance to facilitate the photopolymerization and photodeposition process. Desirably, the distal end of the unitary fiber optic array is first functionalized by treatment with 3 trimethoxysilylpropylmethacrylate to attach a photopolymerizable acrylate group to the glass surface which facilitates the adhesion of the formed polymer to the glass surface. The functionalized unitary fiber optic array is then placed in the assembled photodeposition assembly and system shown by FIG. 1.

The effect of introducing light energy using the assembly and system of FIG. 1 is shown in greater detail by FIG. 2. As shown therein, FIG. 2 schematically shows the preservation of the photopattern 42 created by the mask 40 as a series of arranged dark and light areas which is then imaged through the microscope objective 52 onto the proximal end surface of the functionalized unitary fiber optic array 100. The photopattern 42 of light energy rays and dark areas is preserved in form and is reduced 15 times in actual dimensions by the microscope objective 52 as the photopattern 42 is projected onto the proximal end of the unitary fiber optic array 100. This permits very large masks and very complex arrangements of darkened areas and lighted areas to be used for photopatterning; and allows a diverse range of complex arranged photopatterns to be prepared in large format masks and in complex detailing and precise dimensions because the generated photopattern produced by the mask is actually reduced in true dimensions and area 15 times before being focused upon the promixal end of the unitary fiber optic array. In each instance, however, the photopattern of darkened areas and lighted areas will be accurately and faithfully reproduced in scale and in reduced dimensions when introduced to the proximal end of the unitary fiber optic array.

II. The Organization and Construction of the Preformed, Unitary Fiber Optic Array The unique fiber optic array, its organization and construction, and its component parts are illustrated by FIGS. 3–7 respectively. Each discrete, unitary fiber optic array is a preformed bundle comprised of a plurality of individually clad, fiber optical strands disposed coaxially along their lengths. The smallest common repeating unit within the preformed array is thus a single fiber optical strand. The manner in which these optical fiber strands are prepared and the manner in which these prepared optical strands are joined collectively into a preformed unitary optic array are conventionally known, but are fundamental to a proper understanding and use of the present invention.

A. The Individually Clad, Optical Fiber Strand

A preferred optical fiber strand is illustrated by FIGS. 3 and 4A and 4B. As seen therein, an individual optical fiber strand 10 is comprised of a single optical fiber or core 12 having a rod-like shaft 14 and two fiber core ends 16,18, each of which provides a substantially planar end surface. The intended distal surface 20 at the fiber end 16 is illustrated by FIG. 2A while the intended proximal surface 22 at the fiber end 18 is illustrated within FIG. 2B. It will be recognized and appreciated that the terms "proximal" and "distal" are relative and interchangeable until the strand is ultimately positioned in an apparatus. The optical fiber 12 is composed typically of glass or plastic; and is a flexible rod able to convey light energy introduced at either of its ends 16 and 18. Such optical fibers 12 are conventionally known and commercially available. Alternatively, the user may himself prepare individual optical fibers in accordance with the practices and techniques reported in the scientific and industrial literature. Accordingly, the optical fiber 12 is deemed to be conventionally known and available as such.

It will be appreciated that FIGS. 3 and 4 are illustrations in which the features have been purposely magnified and exaggerated beyond their normal scale in order to provide both clarity and extreme detail. Typically, the conventional optical fiber 12 has a cross-sectional diameter of about 1–50 micrometers, this micrometer range being most commonly used; and is routinely employed in lengths ranging between meters (in the laboratory) to kilometers (in field telecommunications). Moreover, although the optical fiber 12 is illustrated via FIGS. 3 and 4 as a cylindrical extended rod having substantially circular proximal and distal end surfaces, there is no requirement or demand that this specific configuration be maintained. To the contrary, the optical fiber may be polygonal or asymmetrically shaped along its axial length; can be provided with special patterns and shapes at the proximal and/or distal end faces; and need not always present an end face surface which is substantially flat or planar. Nevertheless, for best results, it is presently believed that the substantially cylindrical and rod-like optical fiber strand having planar end face surfaces is most desirable.

Each optical fiber core 12 is desirably individually clad axially along its length by cladding 26. This cladding 26 is composed of any material with a lower refractive index than the fiber core and prevents the transmission of light energy photons from the optical fiber 12 to the external environment. The cladding material 26 may thus be composed of a variety of radically different chemical formulations including various glasses, silicones, plastics, platings, and shielding matter of diverse chemical composition and formulation. The manner in which the optical fiber core 12 is clad is conventionally known and is thus inconsequential and of no particular importance to the present invention. Many methods of deposition, extrusion, painting and covering are scientifically known and industrially available; and any of these conventionally known processes may be chosen to meet the cladding requirements and convenience of the user. Moreover, the quantity or thickness of cladding employed need only be that minimal amount which effectively prevents light energy conveyed by the optical fiber core 12 from escaping into the ambient environment. It will be recognized and appreciated therefore, that the depth of cladding 26 as appears within FIGS. 1 and 2 respectively is greatly exaggerated and purposely thickened in appearance in order to show the general relationship of parts; and appears herein without scale or precise ratios between the cladding 26 and the optical fiber core 12.

It will also be recognized that the configuration of the cladding 26 as shown by FIGS. 3 and 4 has been shaped as a circular coating to illustrate a preferred embodiment of the cladding 26 as it extends co-axially along the length of the optical fiber 12. For purposes of added clarity also, FIG. 3 reveals the individually clad, optical fiber strand 120 in partial cross-section to demonstrate the relationship between the optical fiber core 12 and the cladding 26 which is coextensive along its length.

B. The Preformed Unitary Optic Array

While the single repeating unit comprising the preformed fiber optic sensor is the individually clad, fiber optic strand described previously, it is the organizational positioning and alignment of the many, individually clad, optical fiber strands as a unitary array which is an essential component of the invention. A typical coherent fiber optic array is illustrated by FIGS. 5–7 respectively.

The unitary fiber optic array 100 app ears in exaggerated, highly simplified view s without regard to scale within FIG. 5. The preformed array is composed of a plurality of individually clad, optical fiber strands which collectively lie co-axially along their respective lengths as the discrete, unitary optic array 104 of fixed and determinable configuration and dimensions. The optic array 104 has a unitary, rod-like collective body 106 and intended distal and proximal collective ends 108, 110 formed of multiple optical fiber strand end faces. The intended distal collective end 108 provides a substantially planar and smooth optic array surface 112; similarly, the intended proximal collective end 110 provides an optic array surface 114. The topographical surface 116 is the result of fusing the clad of each fiber optical strand 102 collectively with a filler material 118 such that the fusion is drawn and appears as a discrete, unitary array.

In this manner, the exterior surface 116 of the collective body 106 may be configured and dimensioned as an assembly in an acceptable manner and useful manner. It will be recognized and appreciated also that a substantially cylindrical configuration and topography is maintained and presented by the unitary fiber optic array 100 merely as one preferred embodiment. If desired, any other regular or irregular configuration and design may be achieved and employed to satisfy the individual user's needs or desires.

For purposes of clarity and ease of understanding, FIGS. 6–7 present a very limited and greatly reduced number of individually clad, optical fiber strands 102 present within the preformed optical array 104. A total of only 120 individually clad, fiber optical strands are seen to comprise the optical array 104 in greatly magnified and scale-exaggerated views. Moreover, the relationship of the optic array surface 112 (the intended distal end) with respect to the other optic array surface 114 (the intended proximal end) becomes simplified and more-readily appreciated when using this limited number of 120 optical fiber strands. In practice and reality, however, it is estimated that typically there are 2000–3000 optical fiber strands (commonly varying from about 1.0–5.0 micrometers in core breadth) in a conventional unitary fiber optic array which is often about 100 micrometers to about 1 centimeter in overall diameter. Thus the true total number of individually clad, optical strands forming the unitary imaging fiber optic array will typically be in the thousands and vary substantially with the cross-sectional breadth or diameter of each optical fiber core and the thickness of the cladding material employed when constructing the optical fiber strands themselves.

The construction, organization, and positional alignment within a typical unitary fiber optic array is revealed by FIGS. 5–7. For descriptive purposes only, each of the individually clad, optical fiber strands is presumed to be linearly straight in position and has been arbitrarily assigned an identifying number S1–S120 (as shown via FIGS. 6 and 7). The intended distal optic array surface 114 of FIG. 7 and the intended proximal optic array surface 112 of FIG. 6 together show that each of the individual optical fiber strands S1–S120 can be identified and distinguished from its adjacently disposed neighbor as well as from any other optical fiber strand within the preformed unitary optic array 104.

It will be recognized and appreciated also that the preferred overall organization of the individually clad, optical fiber strands 102 within the unitary array 100 is as co-axially aligned and parallel strands which maintain their relative organizational positioning in a coherent and consistently aligned manner over the entire length of the collective body 106. This is deemed to be the most desirable and most easily constructable organization scheme for the preformed optical fiber array of the present invention.

Although this highly organized, coherent, and rigidly aligned collective construction is deemed to be most desirable, this high degree of organizational alignment is not an absolute requirement for each and every embodiment of the unitary optical array. Alternative manufacturing practices allow for a less restricted disposition of the individually clad, optical fiber strands disposed co-axially along their lengths. Although substantially less desirable, a partially random disposition and a completely random alignment of the optical fiber strands will nevertheless also result in a unitary collective body of optical fiber strands and in proximal and distal collective ends formed of multiple strand end faces which provide two discrete optical array end surfaces. It will be recognized therefore that while the individually clad, optical fiber strands may lie adjacent one another at one end, they may deviate and meander through the length of the array such that their position relative to one another may vary substantially in part or in whole—thereby creating semi-coherent or incoherent positional alignments which vary in the randomness of their organizational construction. While these are far less desirable embodiments, there is no absolute requirement that the positioning of the intended proximal end of one strand be aligned and/or identical with the positioning of the intended distal end within the unitary optic array.

The entirety of the construction for the unitary optical fiber array (whether uniformly coherent, semi-random, or completely randomly organized) provides a means of introducing light energy photons of any determinable wavelength at one optic array end surface with the knowledge and certainty that the light energy will exit at the other optic array end surface. Therefore, by using the highly preferred completely coherent and rigidly maintained parallel alignment of strands illustrated by FIGS. 6 and 7 (the intended distal and proximal optic array end surfaces respectively) of a unitary fiber optic array, the user may introduce light energy to a portion or all of the "proximal" optic array end surface 112 and have accurate knowledge and confidence that the light energy would be conveyed by the fiber strands and exit from the "distal" optic array surface 114. Conversely, were light energy introduced to the "distal" optic array surface 114, the light energy will be conveyed by the optical fibers of the array and will exit from the "proximal" optic array surface 112.

C. The Generation and Conveyance of Individual, Micrometer-Sized Beams of Light Energy When a broad shaft of light energy of determinable wavelength and intensity is introduced to at least a portion of one (presumably the "proximal") optic array surface of an unitary fiber optic array, the very constructional format and organization plan of the unitary optic array function and act to divide the shaft of light into multiple individual beams of light energy each having a limited cross-sectional breadth ranging from about 1.0 micrometers to about 50 micrometers in size. This division of a shaft of light into many individual beams of micrometer-sized light energy is caused and effected by the multiple optical fiber strand end faces forming the optic end surface of the unitary optic array.

It will be recognized and appreciated that as the broad shaft of light strikes each strand end face, the cladding surrounding each optical fiber of each strand allows only the individual optical fiber core (typically limited in diameter to a range of about 1.0–50 micrometers) to be illuminated by the totality of the light; and the cladding surrounding the core directly shields and effectively prevents each optical fiber strand end face from accepting light energy greater than about 1.0–50 micrometers in breadth due to the presence of the cladding material. Th us, each optical fiber strand end face comprising the optic end surface of the preformed unitary optic array individually creates and promulgates a single beam of light energy photons limited typically in breadth to a range from 1.0–50 micrometers.

Moreover, since the preformed unitary op tic array is comprised of a plurality of clad optical fiber strands disposed co-axially along their lengths each having two strand end faces, each optical fiber strand, upon illumination, is able to bring about and accomplish the following: (a) Individual formation of a single beam of light energy in a prechosen and restricted diameter (or cross-sectional breadth) which is limited and controlled directly only by the actual width size (diameter) of the optical fiber core contained within the cladding material comprising the strand; thus, as the core diameter of the optical fiber strand varies between about 1.0–50 micrometers, the comparable diameter or breadth of the individual beam of light energy resulting also will be varied from about 1.0–50 micrometers. The actual core size will be decided in advance and will accommodate the intended application or needs of the user. (b) Only those individual optical fiber strands comprising the unitary optic array which are actually illuminated by the broad shaft of light will provide an individual beam of light energy limited in cross-sectional breadth to a specific range. (c) Once an individual beam of light energy of limited size range is generated, the optical fiber strand will convey that generated light energy beam along its axial length to the other strand end face. (d) When the conveyed beam of light energy reaches the other (presumably the "distal") end face of the optical fiber strand, the individual beam of light energy will become discharged from the end face into the ambient environment as a size limited beam ranging typically from about 1–50 micrometers in breadth. (e) Depending upon the number of strand end faces actually illuminated at the "proximal" end surface of the unitary fiber optic array by the broad shaft of light, an equal number of micrometer-sized, individual beams of light energy will be concurrently generated and discharged from the "distal" end surface of the unitary optic array. Thus, by carefully controlling the scope of illumination of the "proximal" optic surface by the broad shaft of light to only specifically chosen optical fiber strand end faces, the user can effect the controlled concurrent discharge of specifically positioned, multiple, individual beams of light energy each of which is limited in size to about 1.0–50 micrometers in breadth.

III. The Patterned Template for Photopolymerization and Photodeposition

As shown previously by FIG. 2, when a shaft of light is converted into a photopattern comprising rays of light energy having a fixed configuration via passage through a prepared mask (or other light converting means), the configured rays of light become directed as a photopattern to specific portions of the proximal end surface of the unitary optic array. Thus, the light energy photons of the photopattern will strike preselected strand end faces of the "proximal" optic array end surface only at precise spatial positions.

As an illustrative example, if the light energy rays of the photopattern were to strike only the optical fibers end faces shown as S49, S51, S61 and S63 of FIG. 6, only these four optical fiber strands located in four particular spatial positions (S49, S51, S61 and S63) will generate individual beams of light energy having a limited diameter in the range of about 1–50 micrometers. The four generated micrometer-sized beams of light energy are then individually concurrently conveyed a long their axial strand lengths to the "distal" optic end surface, and subsequently are concurrently discharged only from these four strand face ends (S49, S51, S61 and S63) as a patterned template of silhouetted zones and light energy zones into the ambient environment. It will be recognized and appreciated that no other spatial positions and no other optical fiber strands in the unitary optic array are involved during the generation, conveyance and discharge of micrometer-sized light energy beams during this illustrative series of events.

As will be described in greater detail hereinafter, the prepared fluid reaction mixture can be disposed directly upon and be held by the distal array end surface of the unitary optic array; or alternatively, the prepared fluid reaction mixture can be placed and contained on the surface of another discrete solid substrate in aligned position but at a fixed distance removed from the distal end surface of the unitary fiber optic array. However, regardless of the quantity of fluid reaction mixture actually disposed on the surface of the remote solid substrate or the distal array end surface, only the individual beams of light energy (limited in size to the 1.0–50 micrometer range) emanating as a patterned template from solely the precise positions of these four strand end faces—S49, S51, S61 and S63—will in this instance initiate photoactivation of the fluid reaction mixture; induce a photopolymerization of the fluid reactants; and cause a photodeposition upon the substrate of a three-dimensional polymer solid or gel. Thus, only those multiple individual beams of light energy discharged as a patterned template from these four optical fiber strands positions will effect photopolymerization and photodeposition; and the fabrication of nanometer or micrometer sized projections and cavities will occur at carefully controlled and precisely positioned points by the arranged silhouetted zones and the configured light energy zones provided by the patterned template and the fiber structure.

IV. The Fluid Prepolymer Reaction Mixture

The present methodology intends that a fluid prepolymer reaction mixture be prepared that can be photocrosslinked to yield a resulting polymer product. At a minimum, the fluid prepolymer reaction mixture will comprise at least one photoinitiator; optionally one fluid solvent, organic and/or inorganic; and at least one chemical entity selected from the group consisting of monomers, dimers, oligomers, copolymers, and homopolymers that can be photocrosslinked into a solid, three-dimensional, polymeric product. When light energy of the appropriate wavelength and intensity (particularly in the form of a patterned template having arranged silhouetted zones and configured light energy zones) is directed to a quantity or aliquot of prepared fluid prepolymer reaction mixture disposed upon the surface of a solid substrate, a photoinitiated chemical reaction occurs within a set or fixed period of time. The photoinitiated chemical reaction causes a cross-linking effect among the reactants of the reaction mixture; and causes the fabrication and photodeposition of a three-dimensional polymer microstructure on the surface of the solid substrate. Moreover, the effect of the patterned template of arranged silhouetted zones and configured light energy zones causes the fabricated polymer microstructure to present one or more shaped polymeric projections having a breadth ranging from about 0.5–50 micrometers which correspond in shape to the configured light energy zones of the patterned template; and correspondingly, the fabricated polymer microstructure also presents one or more shaped cavities having a breadth ranging from about 0.1–50 micrometers which correspond in shape to the arranged silhouetted zones of the patterned template. After the precisely defined and micrometer-scale patterned polymer structure has been fabricated, the excess polymerization fluid is removed by rinsing the fabricated microstructure with a non-reactive liquid such as ethanol.

The ingredients and manner of preparing the fluid prepolymer reaction mixture are all conventionally known and frequently employed both in industry and in the research laboratory. Nevertheless, the reader is provided herein with representative examples of each reactant to be employed when preparing the fluid prepolymer reaction mixtures. Accordingly, a representative but non-exhaustive listing of photoinitiators are provided by Table 1; an illustrative but incomplete listing of suitable optional solvents is stated by Table 2; an examplary listing of photopolymerizable chemical entities is presented by Table 3; and a useful but incomplete listing of desirable but optional additives is given by Table 4.

TABLE 1

Representative Photoinitiators

| | |
|---|---|
| A. | Metals |
| | Tris (2,2$^1$-bipyridyl) Ruthenium (II) chloride [Ru(bpy)$_3$$^{2+}$] and |
| | Pentaaminechlorocobalt (III) chloride [Co (NH$_3$)$_5$ Cl$^{2+}$] initiating system. |
| B. | Radical Moieties |
| | Benzoin ethyl ether; |
| | benzophenone; |
| | benzoyl peroxide; |
| | AIBN, 2-2$^1$ azobis(butyronitrile); |
| | 2,2$^1$-dimethoxy-2-phenylacetophenone; |
| | 2,2$^1$-diethoxyacetophenone. |
| C. | Others |
| | Anthraquinone + tetrahydrofuran; |
| | Riboflavin + ammonium persulfate; |
| | Phloxine B + triethylamine. |

TABLE 2

Optional Representative Solvents

| | |
|---|---|
| A. | Organic Solvents |
| | Ethanol; |
| | methanol; |
| | propanol; |
| | dichloromethane; |
| | THF (tetrahydrofuran); |
| | DMSO (dimethyl sufoxide); |
| | DMF (dimethyl formamide); |
| | ethyl acetate; |
| | ethylene glycol. |
| B. | Inorganic Solvents |
| | Water |

TABLE 3

Photocrosslinkable Chemical Entities

| | |
|---|---|
| A. | Monomers |
| | acrylamide |
| | N,N-methylene bis(acrylamide) |
| | hydroxyethylmethacrylate |
| | styrene |
| | vinyl acetate |
| | N-(3-aminopropyl) meth-acrylamide hydrochloride |
| | methyl methacrylate |
| | N-vinyl pyrrolidone |
| | acryloxysuccinimide |
| | pyrrole |
| | aniline |
| | thiophene |
| B. | Comonomer with dimethylsiloxane |
| | (acryloxypropyl) methyl (15–20%) |
| | (aminopropyl) methyl (3–5%) |
| | (methacryloxypropyl) methyl (2–3%) |
| C. | T-structure polydimethylsiloxanes |
| | methacryloxypropyl (25–50%) |
| | vinyl (50–75%) |

TABLE 4

Optional Additives

Indicators:

pH + CO$_2$

Fluorescein
HPTS hydroxypyrene trisulfonic acid
carboxy SNAFL

Oxygen

Ru(bpy)$_3^{2+}$ tris (2,2$^1$ bipyridyl)ruthenium (II) chloride
Ru(Ph$_2$phen)$_3^{2+}$ tris (4,7-diphenyl-1,10-phenanthroline)ruthenium (II)
Ru(phen)$_3^{2+}$ tris (1,10-phenanthroline)ruthenium (II) chloride Metals Calcein
Fluorexon
lumogallion Enzymes Glucose oxidasl
Acetylcholine esterase
Carboxyesterase
penicillinase
urease Antibodies anti viral antigen
anti enzymes Oligonucleotids DNA oligomers
RNA oligomers
peptide nucleic acid (PNA) oligomers

Polymer Fillers:

Polyanhydrides copolymers and homopolymers polysebacic acid
poly(p-carboxyphenoxy)propane
poly(p-caroxyphenoxy)hexane
poly-isophthalic acid Vinyl Polymer copolymers and homopolymers ethylene vinyl acetate copolymer
polyvinylpyrrolidone
polyvinyl alcohol Polyacrylamides poly-2-hydroxyethyl methacrylate Polyglycolic Acids polyglycolide
polyactide
pollyglycolide/lactide copolymer
polyhydroxybutyrate
polyhydroxy valerate
polycaprolactones Hydrogels polyacrylamide
polyvinyl alcohol
poly(2-hydroxyethyl methacrylate)
poly-N-(2-hydroxypropyl methacrylamide)
poly vinylpyrrolidone
polymethyl methacrylate (as adjuvants)

Hydrophobic Compounds ethylene vinyl acetate copolymer
silicone elastomers
microporous polypropylene
cross-linked (meth)acrylates

TABLE 4-continued

Optional Additives

Blends latex
polysaccahride-glycolide
acrylates

Others polyactic acid (polylactide)
polyglycolic acid (polyglycolide)
poly (c-carprolactone): polyvalerolactone
poly (hydroxybutyric acid-co-hydroxyvaleric acid)
poly orthoesters
poly alkylcyanoacrylates
synthetic polypeptides
cross-linked polypeptides and proteins
natural polymers: albumin, gelatin, starch
polyanhydrides:
monomers for: sebacic acid
bis(p-carboxy-phenoxy)-propane
dodecandedioic acid
cellulose acetate trimelltiate
hydroxypropyl methyl cellulose phthalste
cellulose acetate
cellulose acetate propioinate
cellulose triacetate
copolymers of methacrylic acid and methacrylic acid methyl ester (Eudragit L100$^R$)

IV. The Disposition of the Prepared Fluid Prepolymer Reaction Mixture on the Surface of a Solid Substrate After the fluid prepolymer reaction mixture has been prepared from the chosen ingredients in the desired quantitative amounts, the fluid prepolymer reaction mixture is disposed on the surface of a solid substrate, preferably using the assembly shown by FIG. 1 herein. The purpose and function of the solid substrate is to provide a surface initially for the placement and containment of the prepolymer reaction mixture; and secondarily to serve and provide a supporting surface for the prepolymer reaction mixture during the time of exposure to the patterned template of arranged silhouetted zones and configured light energy zones during the time required for photocrosslinking; and finally to serve as a receiving and retaining surface for the photodeposited, three-dimensional polymer microstructure after fabrication.

The supporting substrate is desirably transparent or at least translucent; is formed of a durable material; and desirably has dimensions which permit the substrate to be placed in aligned position with the migrating patterned template comprising arranged silhouetted zones and configured light energy zones emanating from the unitary fiber optic array.

It is also highly desirable that a minimum distance be maintained between the emanating patterned template formed of individually discharged beams of light energy having a limited breadth of between 1–50 micrometers because of the critical distortions and increasing variances normally encountered as a beam of light energy travels over a set distance. Clearly, the greater the distance of travel for the beam of light energy, the less sharp the focus, and difference between the lighted and dark zones; and the greater the danger and risk of size distortion as well as shape distortion in the configurations of the individual beams of light energy themselves. For these reasons, it is most preferred that the solid substrate be positioned whenever possible as closely to the distal optic array end surface as possible; or in fact that the solid substrate actually be provided by the distal optic array end surface itself.

Thus, if the distal end surface of the unitary fiber optic array is itself to serve as the solid substrate upon which the fluid prepolymer reaction mixture is to be disposed, it is therefore necessary to facilitate direct adhesion and attachment of the resulting polymer microstructure to the distal end surface of the unitary fiber optic array. This is accomplished by preliminarily functionalizing the distal end surface of the optic array by treatment with 3-trimethoxysilylpropylmethacrylate in order to attach a photopolymerizable acrylate group to the glass surface. This provides a functionalized molecular layer which facilitates the photodeposition of the fluid prepolymer reaction mixture to the distal end surface.

In the alternative, a separate and discrete solid substrate may be employed such as a glass coverslip of conventional dimensions. In this instance, the glass coverslip is itself first functionalized with 3-trimethoxysilylpropylmethacrylate to facilitate polymer adhesion; and then an appropriate aliquot (approximately 50 microliter) of the prepared fluid prepolymer reaction mixture is then pipetted onto the surface of the glass substrate. The unitary fiber optic array to be used under these circumstances has a non-functionalized distal end surface. In due course, the non-functionalized distal end surface of the unitary fiber optic array is brought into contact with the glass substrate and is positioned in close proximity to the surface of the glass coverslip. In this manner, a thin fluid layer of prepolymer reaction mixture fluid becomes trapped in space between the glass coverslip surface and the distal end surface of the unitary fiber optic array.

VI. Experimental Studies and Empirical Data

To demonstrate the present photodeposition method for fabricating a three-dimensional patterned polymer microstructure as well as to illustrate the utility and effectiveness of the process using a fully constructed assembly and system, a detailed series of experiments and empirical data are presented which describe the series of manipulative steps required for making micrometer scale products. The experiments described and the empirical data presented conform to good scientific practices and provide data under specified test conditions. It will be expressly understood, however, that the experiments, empirical data, and detailed information which follows hereinafter are merely illustrative, representative, and examplary of the many different microstructures which can be prepared using the present methodology. All of the examples presented hereinafter are thus offered merely to demonstrate the range, variety, and diversity of micrometer-sized structures which can be prepared to meet specified conditions or applications. Under no circumstances, however, is the present methodology to be limited or restricted to the experiments and empirical data presented herein.

Experimental Series 1

Apparatus:

The distal end of an unitary fiber optic array is first functionalized by treatment with 3-trimethoxysilylpropylmethacrylate to attach a photopolymerizable acrylate group to the glass surface which facilitates the adhesion of the polymer to the glass surface. The functionalized unitary fiber optic array is then placed on the photodeposition system described previously herein and illustrated by FIG. 1. Collimated light from a mercury-xenon arc lamp is passed through a neutral density filter slide and then through an excitation bandpass filter to isolate the appropriate initiation light. The initiation light passes through a mask and is imaged through a microscope objective onto the proximal end of the unitary fiber optic array as shown by FIG. 2 herein. The distal end of the unitary fiber optic array is then coated with a thin film of prepolymer by dipping it in a small volume of a prepared prepolymer reaction mixture fluid that can be photocrosslinked. The unitary fiber array is then illuminated for a fixed time by an electronic shutter and the excess polymerization solution is removed by rinsing with ethanol.

Prepared Fluid Prepolymer Reaction Mixture:

A typical hydrophobic polymerization solution contained 500 $\mu$l (15–20% acryloxypropylmethyl siloxane; 80–85% dimethylsiloxane) copolymer [Gelest, Tullytown, Pa.], 30 mg benzoin ethyl ether [Aldrich] and 1000 $\mu$l of dichloromethane (Fisher). A typical hydrophilic polymerization solution contained 1 ml (5% ethylene glycol dimethacrylate, 95% N-vinyl pyrrolidone) of monomer (Aldrich), 60 mg of benzoin ethyl ether, and 1 ml of phosphate buffer (pH 7).

Light Energy And Polymerization Time:

The light flux for deposition was 18.8 mW/cm$^2$, and the polymerization time was 1.5 s.

Scanning Electron Micrograph ("SEM") Measurements:

Measurements were obtained by atomic-force microscopy with a Digital Instruments Dimension 3000 scanning probe microscope. Microstructures on imaging fibers were analyzed in the tapping mode, whereas the microstructure on the glass substrate was analyzed in the contact mode.

Procedures:

Initially, microstructures were produced by using a pinhole mask and placing a focusing lens between the excitation filter and the pinhole (FIG. 2). A 25-$\mu$m-diameter spot was imaged onto the proximal end surface of the unitary fiber optic array. Polymer formed only on the individual fiber strand cores because the glass claddings between the fiber strands of the bundle do not propagate light.

Results:

The photodeposition and fabrication of micrometer sized structures is shown by FIGS. 8A–8D respectively. FIG. 8A shows the packing of the 2- to 3-$\mu$m-diameter polymer spots (center to center) of 4–5 $\mu$m. This pattern corresponds identically to the individual pixels of the imaging fiber strands in the optic array. The side view of the pattern illustrated by FIG. 8B shows that the polymer spots are approximately 2 to 3 $\mu$m in height and appear as hemispheres on the fiber surface. The polydispersity of the polymer microspots is due to the Gaussian distribution of light exiting the pinhole and the type of imaging fiber strands used. Polymer spots on the edges are smaller as a result of decreased light intensity, and the noncircular polymer spots (FIG. 8A) are a result of nonuniform fibers in the bundle. Monodisperse polymeric microstructures were fabricated with a defect-free imaging fiber optic array as shown by FIG. 8C; and these microstructures had polymer spots 2.5 $\mu$m in diameter, spaced 4.5 $\mu$m apart, and 1.2 $\mu$m high.

On careful examination of a scanning electron micrograph (SEM) from a different polymer array preparation, triangular wells with 1-$\mu$m edges as shown by FIG. 8D could be produced by controlling the polymerization reaction composition and time carefully. The wells were fabricated by increasing the concentration of photocrosslinkable oligomer and increasing the illumination time. During polymerization, the polymer first deposits on the fiber strand cores and then continues to deposit between the fiber strands where the cores have their closest approach. The polymer wall between the wells is less than 0.5 $\mu$m wide and 1.0 $\mu$m high. The triangular wells have a volume of 460 al (1 al=0.10$^{-18}$ liters) and could potentially be used as miniature reaction vessels.

Polymer micropatterns were also produced using a standard air force resolution target (chrome or glass) as the photopatterning mask in the assembly of FIG. 1. FIG. 9A shows a light micrograph of a partial air force resolution target. The image was taken through a 10× objective so that only the two middle groups could be observed. It is important to note that the mask has dimensions 15 times as large as those of the resulting microstructures fabricated by photodeposition, thereby facilitating the fabrication of complex micrometer-scale structures by relaxing the need to produce microscale masks.

FIG. 9B shows the resulting fabricated microstructure using the mask of FIG. 9A in the assembly of FIG. 1. FIG. 9B shows a SEM of the polymer microstructure; the group of lines from top to bottom in FIG. 9B were produced from lines that were respectively 176.7, 157.5, and 140 micrometers wide.

Experimental Series 2

Using the same fluid prepolymer reaction mixture, light wavelength, and light intensity as that described in the 1st experimental series, polymer microstructures were also fabricated and photodeposited on the surfaces of solid substrates other than an optic array end surface of a unitary fiber optic array. For example, a glass substrate was first functionalized with 3-trimethoxysilylpropylmethacrylate to facilitate polymer adhesion, and then 50 μl of the prepared fluid prepolymer reaction mixture was pipetted onto the substrate. A nonfunctionalized imaging unitary fiber optic array was brought into contact with the substrate and positioned close to the glass surface, thus trapping a thin layer of prepolymer solution. The solution was irradiated through the fiber optic array for a fixed time and the fiber was then backed off and the substrate rinsed. Polymer deposition occurs on the substrate in a pattern corresponding to that of the optical fibers of the array bundle. The SEM in FIG. 10 shows a fabricated microstructure produced on a glass substrate. The monodisperse polymer spots have a diameter of 2.0 μm, a height of 0.3 μm, and are spaced 4.0 μm apart.

Experimental Series 3

One can also photopolymerize a microstructure formed of polypyrrole on the distal end surface of a fiber optic array. The method of photopolymerization of pyrrole is based on the method reported by Segawa et. al., *J. Chem. Soc., Chem. Comm.* 1989, 132.

Procedure:

The distal end of the imaging fiber optic array was first functionalized by sputter coating a 150 nm gold layer, the layer extending 1 cm down the side of the end surface. The functionalized fiber optic array was held in an x,y micropositioner as shown by FIG. 1. The initiation light from an argon ion laser (1 mm diameter and 20 mW total power) was positioned to illuminate the proximal end surface of the array. A pyrrole photopolymerization solution containing 100 μl of pyrrole (Aldrich), 1 mg of Ru(bpy)$_3^{2+}$(Aldrich), 10 mg Co(NH$_3$)$_5$Cl and 1.9 ml H$_2$O was made; and the distal end surface of the array placed in a capillary tube containing a small volume of the solution. The imaging array was then illuminated for 20 seconds using a manual shutter and the excess polymerization solution removed by rinsing with H$_2$O.

Conclusions

These experiments and empirical data have demonstrated the ability to fabricate micrometer-size polymer structures. These structures can be fabricated directly on optical imaging fibers as well as on other glass substrates, and the micrometer-size photopatterns are deposited with large, easily produced masks. The chosen patterns of polymer spots can be monodisperse and highly ordered. The approach is general for any photopolymerizable monomer or oligomer; and both hydrophilic and hydrophobic microstructures have been made with N-vinyl pyrrolidone, and a photopolymerizable polydimethylsiloxane, respectively. By decreasing the monomer or oligomer concentration, the polymerization time, or both, polymer spots smaller than 2.5 μm, but with the same center-to-center spacing, can be produced. Polymer microstructures with decreased polymer spacings could also be produced by using imaging fibers with smaller core diameters. Such arrays could have many uses because of their ease of fabrication, the diversity of polymer functionality, and their three-dimensional character. This last feature allows for high loadings of immobilized molecules, which was achieved by immobilizing fluorescent indicators in the polymer array for use as optical sensors. This polymeric microstructure array has the advantage that each polymer spot is not in contact with any other spots. Furthermore, each polymer spot of the array is connected to its own optical channel, allowing individual spots to be addressed with little or no crosstalk between adjacent spots.

The present invention is not to be restricted in form nor limited in scope except by the claims appended hereto.

What is claimed is:

1. A photodeposition method for fabricating a three-dimensional polymer microstructure of prearranged pattern and precise scale, said photo deposition method comprising the steps of:

furnishing at least one shaft of light energy of determinable wavelength, intensity, and exposure time;

supplying a preformed, unitary fiber optic array comprising a plurality of clad optical fiber strands disposed co-axially along their lengths and having two discrete optic array end surfaces each formed of multiple optical fiber strand end faces, said preformed, unitary optic array being of determinable configuration and dimensions, and said discrete optic array end surfaces presenting multiple optical fiber strands and strand end faces having determinable dimensions for conveyance and discharge of light energy;

preparing a fluid prepolymer reaction mixture composition comprising at least one photoinitiator and at least one chemical entity selected from the group consisting of monomers, dimers, oligomers, copolymers, and homopolymers that can be photocrosslinked to yield a photodeposited polymer product, said photoinitiator and said chemical entity being admixed at predetermined concentrations;

immersing a solid substrate surface in said fluid prepolymer mixture at a distance less than 50 micrometers from said discrete optic array end surfaces;

adjusting said light energy intensity, said wavelength, and said exposure time to said concentrations and said composition of said prepolymer mixture for precisely scaling and sizing the pattern of said three-dimensional polymer microstructure;

introducing said shaft of light energy to only a portion of said multiple optical fiber strand end faces forming one optic array end surface of said unitary optic array such that said introduced shaft of light energy becomes divided into a prearranged pattern of multiple beams of light energy which are individually conveyed through preselected ones of said multiple optical fiber strands of said unitary optic array and said conveyed multiple beams are discharged as a patterned template of configured light energy zones from the other optic array end surface of said unitary optic array, said discharged multiple individual beams of light energy having individual beam dimensions essentially equivalent to said determinable dimensions of said multiple optical fiber strands and strand end faces;

directing said multiple individual beams of light energy to said substrate surface;

depositing a cured polymer on said substrate surface by way of a photoinitiated polymerization reaction, whereby a three-dimensional and integral photodeposited polymer microstructure of prearranged pattern and precise scale is formed on said substrate surface, said integral polymer microstructure comprising a plurality of precisely scaled polymeric projections each having a breadth and shape essentially equivalent to said determinable dimensions of said multiple optical fiber strands; and terminating the deposition of said cured polymer microstructure when the breadth of said polymeric projections is essentially equivalent to the dimension of said individual optical fiber strand end faces, wherein said fabricated polymer microstructure is an electroactive microelectrode.

2. A photo deposition method for fabricating a three-dimensional polymer microstructure of prearranged pattern and precise scale, said photo deposition method comprising the steps of:

furnishing at least one shaft of light energy of determinable wavelength, intensity, and exposure time;

providing a masking means for converting said shaft of light energy into a prechosen photopattern comprised of at least one light energy ray having a fixed configuration;

supplying a preformed, unitary fiber optic array comprising a plurality of clad optical fiber strands disposed co-axially along their lengths and having two discrete optic array end surfaces each formed of multiple optical fiber strand end faces, said preformed, unitary optic array being of determinable configuration and dimensions, and said discrete optic array end surfaces presenting multiple optical fiber strands and strand end faces having determinable dimensions for conveyance and discharge of light energy;

preparing a fluid prepolymer reaction mixture composition comprising at least one photoinitiator and at least one chemical entity selected from the group consisting of monomers, dimers, oligomers, copolymers, and homopolymers that can be photocrosslinked to yield a photodeposited polymer product, said photoinitiator and said chemical entity being admixed at predetermined concentrations;

immersing a solid substrate surface in said fluid prepolymer mixture at a distance less than 50 micrometers from said discrete optic array end surfaces;

adjusting said light energy intensity, said wavelength, and said exposure time to said concentrations and said composition of said prepolymer mixture for precisely scaling and sizing the pattern of said three-dimensional polymer microstructure;

introducing said photopatterned shaft of light energy to only a portion of said multiple optical fiber strand end faces forming one optic array end surface of said unitary optic array such that said introduced photopatterned shaft of light energy becomes divided into a prearranged pattern of multiple beams of light energy which are individually conveyed through preselected ones of said multiple optical fiber strands of said unitary optic array and said conveyed multiple beams are discharged as a patterned template of configured light energy zones from the other optic array end surface of said unitary optic array, said discharged multiple individual beams of light energy having, individual beam dimensions essentially equivalent to said determinable dimensions of said multiple optical fiber strands and strand end faces;

directing said multiple individual beams of light energy to said substrate surface; depositing a cured polymer on said substrate surface by way of a photoinitiated polymerization reaction, whereby a three-dimensional and integral photodeposited polymer microstructure of prearranged pattern and precise scale is formed on said substrate surface, said integral polymer microstructure comprising a plurality of precisely scaled polymeric projections each having a breadth and shape essentially equivalent to said determinable dimensions of said multiple optical fiber strands; and terminating the deposition of said cured polymer microstructure when the breadth of said polymeric projections is essentially equivalent to the dimension of said individual optical fiber strand end faces, wherein said fabricated polymer microstructure is an electroactive microelectrode.

3. A photodeposition method for fabricating a three-dimensional polymer microstructure of prearranged pattern and precise scale, said photo deposition method comprising the steps of:

furnishing at least one shaft of light energy of determinable wavelength, intensity, and exposure time;

supplying a preformed, unitary fiber optic array comprising a plurality of clad optical fiber strands disposed co-axially along their lengths and having two discrete optic array end surfaces each formed of multiple optical fiber strand end faces, said preformed, unitary optic array being of determinable configuration and dimensions, and said discrete optic array end surfaces presenting multiple optical fiber strands and strand end faces having determinable dimensions for conveyance and discharge of light energy;

preparing a fluid prepolymer reaction mixture composition comprising at least one photoinitiator and at least one chemical entity selected from the group consisting of monomers, dimers, oligomers, copolymers, and homopolymers that can be photocrosslinked to yield a photodeposited polymer product, said photoinitiator and said chemical entity being admixed at predetermined concentrations;

immersing a solid substrate surface in said fluid prepolymer mixture at a distance less than 50 micrometers from said discrete optic array end surfaces;

adjusting said light energy intensity, said wavelength, and said exposure time to said concentrations and said composition of said prepolymer mixture for precisely scaling and sizing the pattern of said three-dimensional polymer microstructure;

introducing said shaft of light energy to only a portion of said multiple optical fiber strand end faces forming one optic array end surface of said unitary optic array such that said introduced shaft of light energy becomes divided into a prearranged pattern of multiple beams of light energy which are individually conveyed through preselected ones of said multiple optical fiber strands of said unitary optic array and said conveyed multiple beams are discharged as a patterned template of configured light energy zones from the other optic array end surface of said unitary optic array, said discharged multiple individual beams of light energy having individual beam dimensions essentially equivalent to said determinable dimensions of said multiple optical fiber strands and strand end faces;

directing said multiple individual beams of light energy to said substrate surface;

depositing a cured polymer on said substrate surface by way of a photoinitiated polymerization reaction, whereby a three-dimensional and integral photodeposited polymer microstructure of prearranged pattern and precise scale is formed on said substrate surface, said integral polymer microstructure comprising a plurality of precisely scaled polymeric projections each having a breadth and shape essentially equivalent to said determinable dimensions of said multiple optical fiber strands;

terminating the deposition of said cured polymer microstructure when the breadth of said polymeric projections is essentially equivalent to the dimension of said individual optical fiber strand end faces; and rinsing said substrate surface to remove uncured prepolymer fluid, wherein said solid substrate surface is a coverslip.

\* \* \* \* \*

UNITED STATES PATENT AND TRADEMARK OFFICE
CERTIFICATE OF CORRECTION

PATENT NO.      : 6,200,737 B1
DATED           : March 13, 2001
INVENTOR(S)     : Walt et al.

It is certified that error appears in the above-identified patent and that said Letters Patent is hereby corrected as shown below:

<u>Column 1,</u>
Line 5, prior to the first sentence of the specification, please insert the following:

-- This invention was made with government support under GM48142 awarded by the National Institutes of Health and W-7405-ENG-48 awarded by the Department of Energy. The government has certain rights in the invention. --

Signed and Sealed this

Fourth Day of March, 2003

JAMES E. ROGAN
*Director of the United States Patent and Trademark Office*